United States Patent
Roizin et al.

(10) Patent No.: US 10,210,526 B2
(45) Date of Patent: Feb. 19, 2019

(54) IMAGE SENSOR MODULE AND A METHOD FOR EVALUATING AN IMAGE SENSOR

(71) Applicants: Tower Semiconductor LTD., Migdal Haemek (IL); HillBerry GAT LTD., Rehovot (IL)

(72) Inventors: Yakov Roizin, Afula (IL); Viktor Goldovsky, Rehovot (IL); Avi Strum, Haifa (IL); Yohanan Davidovich, Herzliya (IL); Amos Fenigstein, Haifa (IL); Assaf Lahav, Binyamina (IL); David Avner, Ramat Hasharon (IL)

(73) Assignees: TOWER SEMICONDUCTOR LTD., Migdal Haemek (IL); HILLBERRY GAT LTD., Rehovot (IL)

( * ) Notice: Subject to any disclaimer, the term of this patent is extended or adjusted under 35 U.S.C. 154(b) by 321 days.

(21) Appl. No.: 14/690,425

(22) Filed: Apr. 19, 2015

(65) Prior Publication Data

US 2016/0307203 A1 Oct. 20, 2016

(51) Int. Cl.
*G06K 7/10* (2006.01)
*G06Q 30/00* (2012.01)
*H01L 27/146* (2006.01)

(52) U.S. Cl.
CPC ..... *G06Q 30/018* (2013.01); *H01L 27/14621* (2013.01); *H01L 27/14625* (2013.01); *H01L 27/14627* (2013.01); *H01L 27/14634* (2013.01)

(58) Field of Classification Search
CPC .............................. G06K 19/14; G06K 7/086
USPC ................................. 235/468, 435, 439, 454
See application file for complete search history.

(56) References Cited

U.S. PATENT DOCUMENTS

| | | | | |
|---|---|---|---|---|
| 5,350,715 A * | 9/1994 | Lee | ........................ | H01L 23/544 257/E23.179 |
| 2004/0190090 A1* | 9/2004 | Spears | ................. | H04N 1/1931 358/514 |
| 2007/0262980 A1* | 11/2007 | Ying | ....................... | H04N 3/155 345/418 |
| 2011/0249111 A1* | 10/2011 | Weiss | ...................... | H01L 22/12 348/87 |
| 2012/0225514 A1* | 9/2012 | Wada | ................. | H01L 27/14618 438/65 |
| 2012/0228745 A1* | 9/2012 | Wu | ...................... | H01L 23/3677 257/621 |

* cited by examiner

*Primary Examiner* — Daniel St Cyr
(74) *Attorney, Agent, or Firm* — Reches Patents

(57) ABSTRACT

An image sensor module that comprises a die, wherein the die comprises light sensors and optics; and wherein the optics comprises luminescent elements that represent die manufacturing information that is indicative of a manufacturing process of the die.

22 Claims, 13 Drawing Sheets

10'

10"

10'''

IMAGE SENSOR MODULE AND A METHOD FOR EVALUATING AN IMAGE SENSOR

BACKGROUND OF THE INVENTION

Counterfeit image sensor modules usually exhibit a lower quality than the original image sensor modules. Installing a counterfeit image sensor module within a device may dramatically reduce the reliability and durability of the device.

There is a growing need to authenticate an image sensor module in order to ensure that the image sensor module is not a counterfeit image sensor module.

An image sensor module includes a die. The die may be subjected to process variations. Accordingly—dice of different image sensor modules may differ from each other by their lifespan, quality and/or durability.

Image sensor module dice typically do not include information about their manufacturing process.

There is also a growing need to authenticate image sensor modules and to obtain information about the image sensor modules.

SUMMARY

According to an embodiment of the invention there may be provided an image sensor and a method for evaluating an image sensor.

According to an embodiment of the invention there may be provided an image sensor module that may include a die, wherein the die may include light sensors and optics; and wherein the optics may include luminescent elements that represent die manufacturing information that may be indicative of a manufacturing process of the die.

The die manufacturing information may be indicative of at least one out of (a) an identity of a wafer that included the die, (b) an identity of a batch that included the die, (c) timing information about timing of execution of the manufacturing process of the die, (d) information about the image sensor module. The information about the image sensor module may include an identifier of the image sensor module and/or of a product that includes (or should include) the image sensor module.

The luminescent elements may be substantially transparent to radiation sensed by the light sensors.

The luminescent elements may be configured to convert a first frequency radiation to a second frequency radiation; wherein at least one light sensor of the light sensors may be configured to sense the second frequency radiation and may be configured not to sense the first frequency radiation.

The first frequency radiation may be an ultraviolet radiation and the second frequency radiation may be a visible light.

The first frequency radiation may be an infrared radiation and the second frequency radiation may be a visible light.

The image sensor module may include a readout circuit that may be configured to receive signals from the light sensors and to extract the die manufacturing information.

The image sensor module may include a readout circuit and a processor, wherein the readout circuit may be configured to receive signals from the light sensors and to output readout information indicative of the second frequency radiation emitted from the luminescent elements; wherein the processor may be configured to process the readout information and to extract the die manufacturing information.

The optics may include a group of lenses and a group of color filters.

The at least two color filters of the group of color filters may form luminescent elements that differ from each other by at least one out of composition and concentration.

The at least two color filters of the group of color filters may form luminescent elements luminescent elements that have a same composition and concentration.

The at least one lens of the group of lenses and at least one color filter of the group of color filters may form luminescent elements that differ from each by at least one out of composition and concentration.

The at least one lens of the group of lenses and at least one color filter of the group of color filters may form luminescent elements luminescent elements that have a same composition and concentration.

The optics may be made of a polymer material.

The optics may be made of a photoresist.

The optics may be positioned on a backside of the die.

The optics may be positioned on a front side of the die.

The die further may include a readout circuit that may be configured to receive signals from the light sensors.

The image sensor module may include a readout circuit, wherein the light sensors and the readout circuit may be included in different dice of the image sensor module.

The concentration of a luminescent material within a luminescent element may or may not exceed five percent.

The luminescent elements exhibit a luminescence decay time that ranges between fifty milliseconds and one second.

According to an embodiment of the invention there may be provided an image sensor module that may include a die, wherein the die may include a readout circuit, a processor, light sensors and optics; wherein the optics may include a group of lenses and a group of color filters; wherein multiple optical components out of the group of lenses and a group of color filters may be luminescent elements; wherein the light sensors may be configured to sense radiation emitted from the luminescent elements and to generate signals; wherein the readout circuit may be configured to receive the signals from the light sensors and to output readout information indicative of the radiation emitted from the luminescent elements; and wherein the processor may be configured to process the readout information and to determine whether the radiation emitted from the luminescent elements matches an expected optical property of the luminescent elements.

The processor may be configured to generate an alert when the radiation emitted from the luminescent elements does not match an expected optical property of the luminescent elements.

The expected optical property of the luminescent elements may be luminescence decay kinetics of the luminescent elements.

The at least two color filters of the group of color filters may form luminescent elements that differ from each other by at least one out of composition and concentration.

The at least two color filters of the group of color filters may form luminescent elements luminescent elements that have a same composition and concentration.

The at least one lens of the group of lenses and at least one color filter of the group of color filters may form luminescent elements that differ from each by at least one out of composition and concentration.

The at least one lens of the group of lenses and at least one color filter of the group of color filters may form luminescent elements luminescent elements that have a same composition and concentration.

The optics may be made of a polymer material.

The optics may be made of a photoresist.

The optics may be positioned on a backside of the die.

The optics may be positioned on a front side of the die.

The die may include a readout circuit that may be configured to receive signals from the light sensors.

The image sensor module may include a readout circuit, wherein the light sensors and the readout circuit may be included in different dice of the image sensor module.

The concentration of a luminescent material within a luminescent element may not exceed five percent.

The luminescent elements exhibit a luminescence decay time that ranges between fifty milliseconds and one second.

According to an embodiment of the invention there may be provided an image sensor module that may include a die, wherein the die may include light sensors and optics; wherein the optics may include luminescent elements that have an expected optical property that once detected authenticates the image sensor module.

The expected optical property of the luminescent elements may be a spectral response of the luminescent elements.

The expected optical property of the luminescent elements may be luminescence decay kinetics of the luminescent elements.

The optics may include a group of lenses and a group of color filters.

The at least two color filters of the group of color filters may form luminescent elements that differ from each other by at least one out of composition and concentration.

The at least two color filters of the group of color filters may form luminescent elements luminescent elements that have a same composition and concentration.

The at least one lens of the group of lenses and at least one color filter of the group of color filters may form luminescent elements that differ from each by at least one out of composition and concentration.

The at least one lens of the group of lenses and at least one color filter of the group of color filters may form luminescent elements luminescent elements that have a same composition and concentration.

The optics may be made of a polymer material.

The optics may be made of a photoresist.

The optics may be positioned on a backside of the die.

The optics may be positioned on a front side of the die.

The die may include a readout circuit that may be configured to receive signals from the light sensors.

The image sensor module may include a readout circuit, wherein the light sensors and the readout circuit may be included in different dice of the image sensor module.

The concentration of a luminescent material within a luminescent element may or may not exceed five percent.

The luminescent elements exhibit a luminescence decay time that ranges between fifty milliseconds and one second.

According to an embodiment of the invention there may be provided a method for evaluating an image sensor module, the method may include: illuminating the image sensor module by illuminating radiation; wherein the image sensor module may include a die, wherein the die may include light sensors and optics; wherein the optics may include luminescent elements; detecting a response of the luminescent elements to the illumination by the illuminating radiation; and processing the response in order to extract die manufacturing information that may be indicative of a manufacturing process of the die or authenticate the image sensor module.

The method may include processing the response to extract only die manufacturing information.

The method may include processing the response to extract, during the authentication of the image sensor module, authentication information.

The detecting of the response may be executed by the image sensor module.

The detecting of the response may be executed by a tester that differs from the image sensor module.

The illuminating radiation may be of a frequency and an intensity that may be expected to induce an excitation of at least some of the luminescent elements.

The response may include emitting radiation by the luminescent elements; and wherein the processing of the response may include determining whether the radiation emitted from the luminescent elements matches an expected optical property of the luminescent elements.

The expected optical property of the luminescent elements may be a spectral response of the luminescent elements.

The expected optical property of the luminescent elements may be luminescence decay kinetics of the luminescent elements.

The optics may include a group of lenses and a group of color filters.

The at least two color filters of the group of color filters may form luminescent elements that differ from each other by at least one out of composition and concentration.

The at least two color filters of the group of color filters may form luminescent elements luminescent elements that have a same composition and concentration.

The at least one lens of the group of lenses and at least one color filter of the group of color filters may form luminescent elements that differ from each by at least one out of composition and concentration.

The at least one lens of the group of lenses and at least one color filter of the group of color filters may form luminescent elements luminescent elements that have a same composition and concentration.

The optics may be made of a polymer material.

The optics may be made of a photoresist.

The optics may be positioned on a backside of the die.

The optics may be positioned on a front side of the die.

The die may include a readout circuit that may be configured to receive signals from the light sensors.

The image sensor module may include a readout circuit, wherein the light sensors and the readout circuit may be included in different dice of the image sensor module.

The concentration of a luminescent material within a luminescent element may not exceed five percent.

The luminescent elements exhibit a luminescence decay time that ranges between fifty milliseconds and one second.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1A:
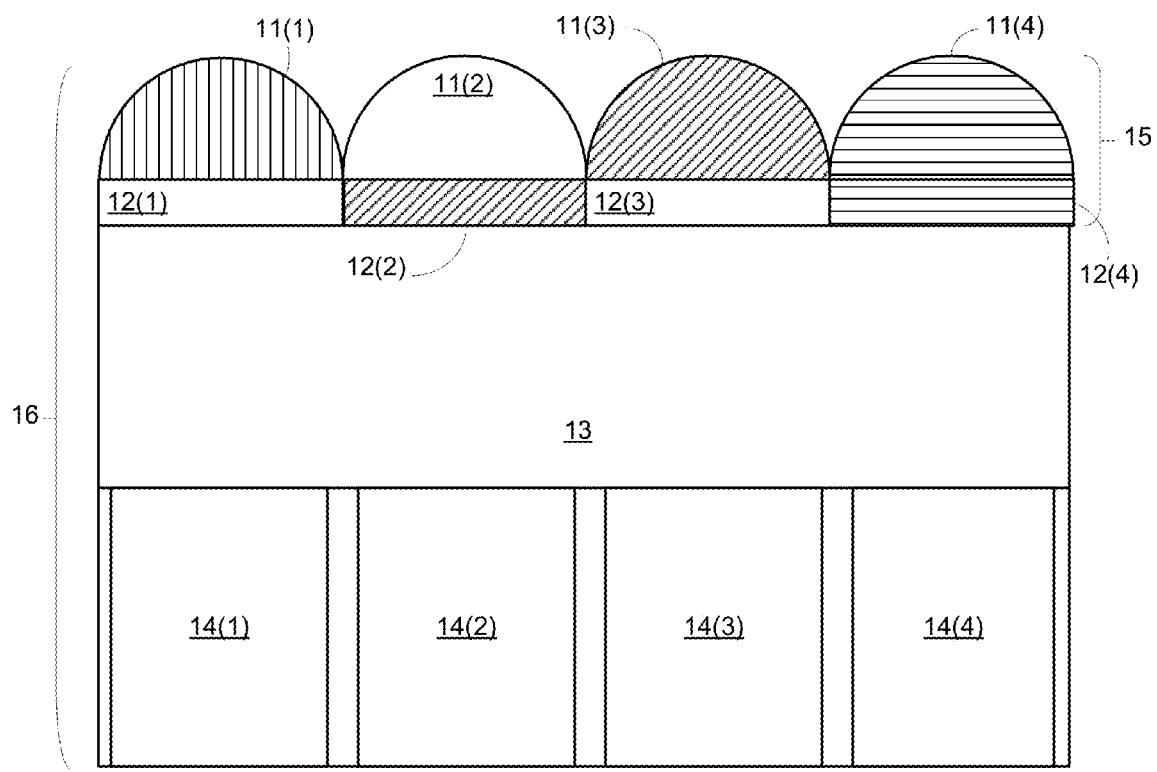
FIG. 1A illustrates a portion of an image sensor module according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

FIG. 1A illustrates a portion of an image sensor module 10 according to an embodiment of the invention.

The image sensor module 10 is arranged to detect radiation and output data about the detected radiation.

Image sensor module 10 includes a die 16. Die 16 includes optics 15 and light sensors such as light sensors 14(1)-14(4).

A non-limiting example of a light sensor is a photodiode or a phototransistor. It is noted that the image sensor module 10 may have much more than four light sensors and that light sensors of an image sensor module 10 may be arranged in a line, in a two dimensional array and the like.

Optics 15 is illustrated as including lenses 11(1)-11(4) and color filters 12(1)-12(4).

Color filter 12(1) is positioned between lens 11(1) and light sensor 14(1). Color filter 12(2) is positioned between lens 11(2) and light sensor 14(2). Color filter 12(3) is positioned between lens 11(3) and light sensor 14(3). Color filter 12(4) is positioned between lens 11(4) and light sensor 14(4).

FIG. 1A also shows interconnect region 13 of the chip consisting of metalization and isolation layers that is positioned between color filters 12(1)-12(4) and light sensors 14(1)-14(4). Radiation that is detected by a light sensor passes through interconnect region 13—and the configuration of FIG. 1A is referred to as a forward configuration.

It is noted that each one of the color filters and the lenses may (or may not) include one or more luminescent materials and may act as luminescent element.

Different luminescent elements may have the composition and concentration.

Alternatively—different luminescent elements may differ from each other by composition and/or concentration. Differences in the composition and/or concentration may result in different spectral response and/or luminescence delay kinetic. As a rule of thumb higher concentration will result in higher emitted radiation (in case of an excitation).

In FIG. 1A the luminescent materials of color filter 12(2) and lens 11(3) differ from the luminescent materials of lens 11(4) and color filter 12(4) and also differ from the luminescent materials of lens 11(1).

The composition and/or concentration of a luminescent element may be determined in response to at least one of the following:

a. A color of a color filter that forms the luminescent element.

b. A color of a color filter that is positioned below a lens that forms the luminescent element.

c. Location of the luminescent element.

d. Information (such die manufacturing information and/or authentication information) as that is represented by the luminescent element.

Non-limiting examples of compositions of luminescent elements are illustrated in U.S. patent application 2008/0076058 and U.S. patent application 20120003582, both incorporated herein by reference.

Non-limiting examples of compositions of luminescent elements include aromatic chemicals, ionic salts and metal alloys.

Organic luminescent pigments (aromatic chemicals) may exhibit UV excitation and VIS emission. Such pigments may show red, blue or green colors by UV excitation and when be mixed together a variety of other colors can be obtained as well. For example—Perylenes, coumarines and others.

Non-limiting examples of compositions of luminescent elements may further include ionic salts are mostly presented by rare Earth ions complexes. The Rare-Earth ions complexes may be mixed with phosphine oxides or Mg/Ba and other salts as ligands, polymer systems doped with Rare-Earth metal ions and so on.

Non-limiting examples of compositions of luminescent elements may also include metal alloys/compositions Zinc compound, Barium and Manganese composition and so on.

The luminescent element may be substantially transparent to radiation sensed by the light sensors 14(1)-14(4). The term "substantially" means that a degree of transparency of the luminescent elements does not affect (beyond an acceptable level) the frequency response of the image sensor module in frequency ranges where the image sensor module is expected to sense radiation. For example, substantially transparent may be associated with an attenuation that may or may not exceed few (less than 10) percent.

Each one of the luminescent elements of the image sensor module may be configured to convert a first frequency radiation to a second frequency radiation. One or more light sensor may sense second frequency radiation but not to sense the first frequency radiation. This conversion may be a frequency up-conversion or a frequency down-conversion. The first frequency radiation may be, for example, infrared or ultraviolet radiation and the second frequency radiation may be visible light radiation.

A frequency up-conversion, a frequency down-conversion and a prolonged luminescence decay may occur under different conditions. For example the frequency down-conversion may occur at a first frequency, the frequency up-conversion may occur at a second frequency and the prolonged luminescence decay may occur at a third frequency.

According to an embodiment of the invention the light sensors are not expected to detect light emitted from the luminescent elements during a normal operation of the image sensor module (when the luminescent elements are not tested)—as the light emitted from the luminescent elements is expected to be below a detection level of the light sensors.

Figure 1B:
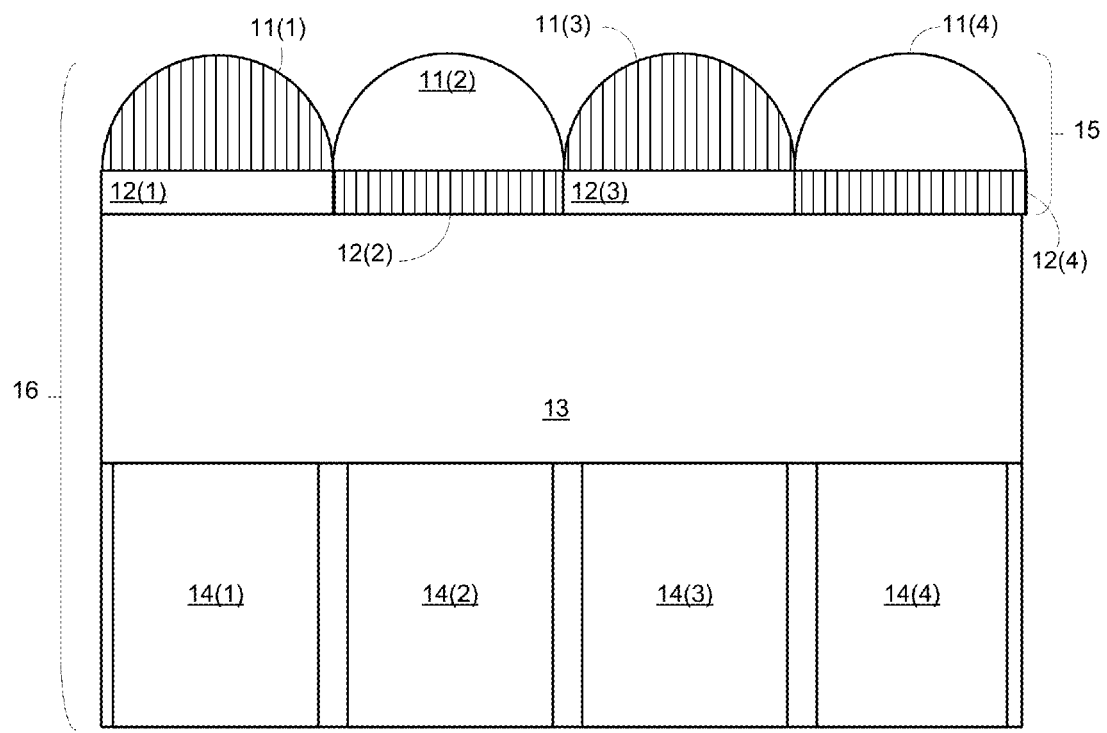
FIG. 1B illustrates a portion of an image sensor module according to an embodiment of the invention.

FIG. 1B illustrates a portion of an image sensor module 10 according to an embodiment of the invention.

In FIG. 1B the luminescent materials of lenses 11(1) and 11(3) and of color filters 12(2) and 12(4) are the same.

Figure 1C:
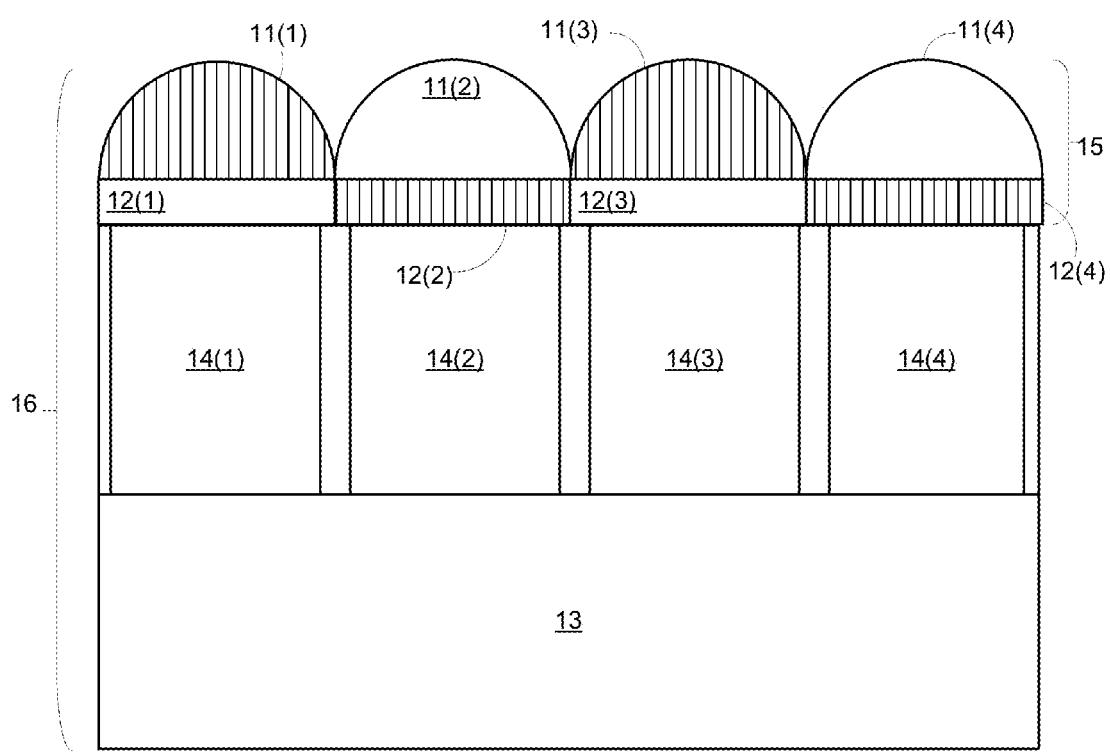
FIG. 1C illustrates a portion of an image sensor module according to an embodiment of the invention.

FIG. 1C illustrates a portion of an image sensor module 10 according to an embodiment of the invention.

In FIG. 1C the luminescent materials of lenses 11(1) and 11(3) and of color filters 12(2) and 12(4) are the same.

FIG. 1C also shows light sensors 14(1)-14(4) that are positioned between color filters 12(1)-12(4) and) metal layer 13—and the configuration of FIG. 1C is referred to as a backward.

Figure 2A:
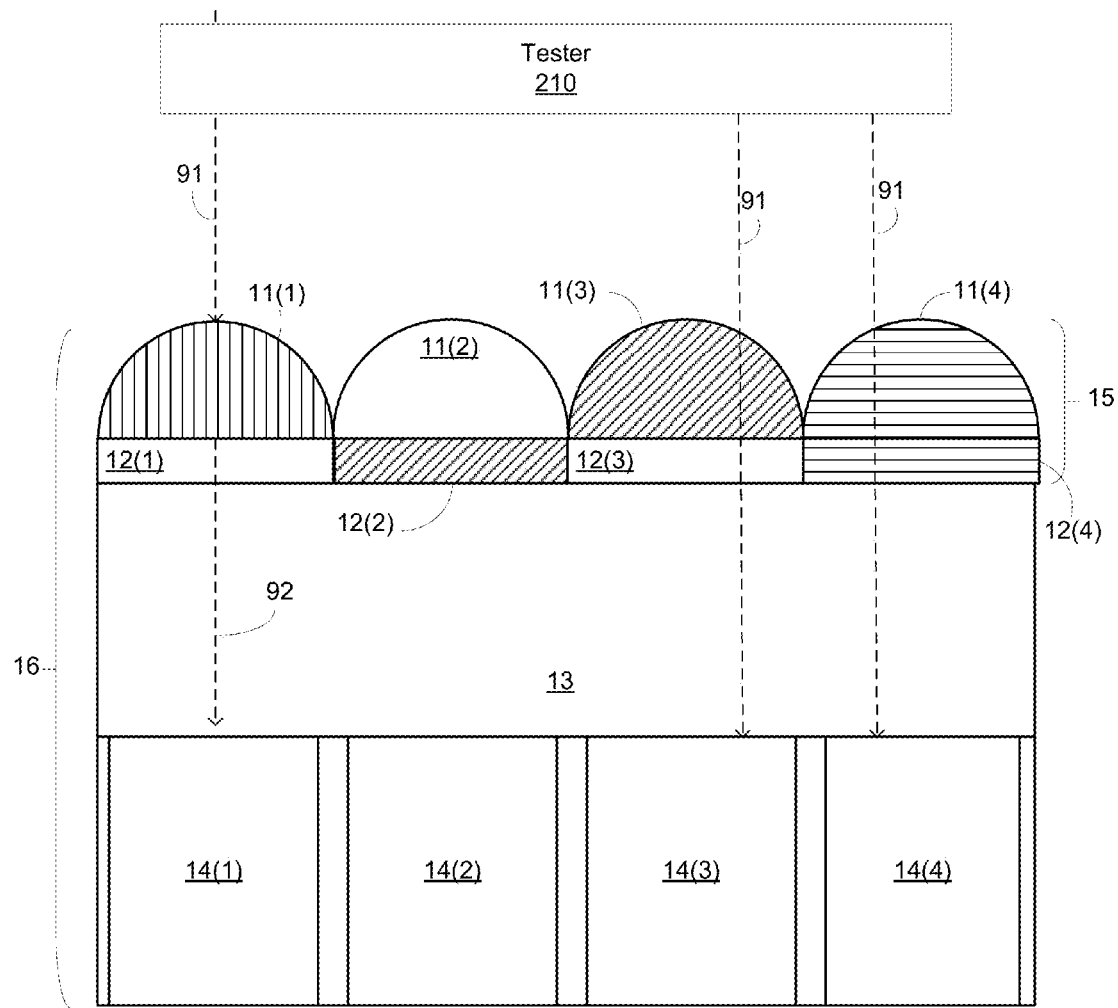
FIG. 2A illustrates a tester and a portion of an image sensor module according to an embodiment of the invention.

FIG. 2A illustrates tester 210 and a portion of an image sensor module 10 according to an embodiment of the invention.

In FIG. 2A the luminescent materials of color filter 12(2) and lens 11(3) differ from the luminescent materials of lens 11(4) and color filter 12(4) and also differ from the luminescent materials of lens 11(1).

Tester 210 illuminates die 16 with a first frequency radiation 91 (for example infrared or ultra violet radiation) that is normal to die 16 (normal illumination).

This causes lens 11(1) to convert the first frequency radiation 91 to second frequency radiation 92 (for example visible light radiation) that is sensed by light sensor 14(1).

Lens 11(4) and color filters 12(1) and 12(4) are made of different luminescent materials than lens 11(1) and do not perform a frequency conversion—the first frequency radiation 91 passes through them and may impinge on light sensors 14(2)-14(4)—and will not be detected by these light sensors.

Figure 2B:
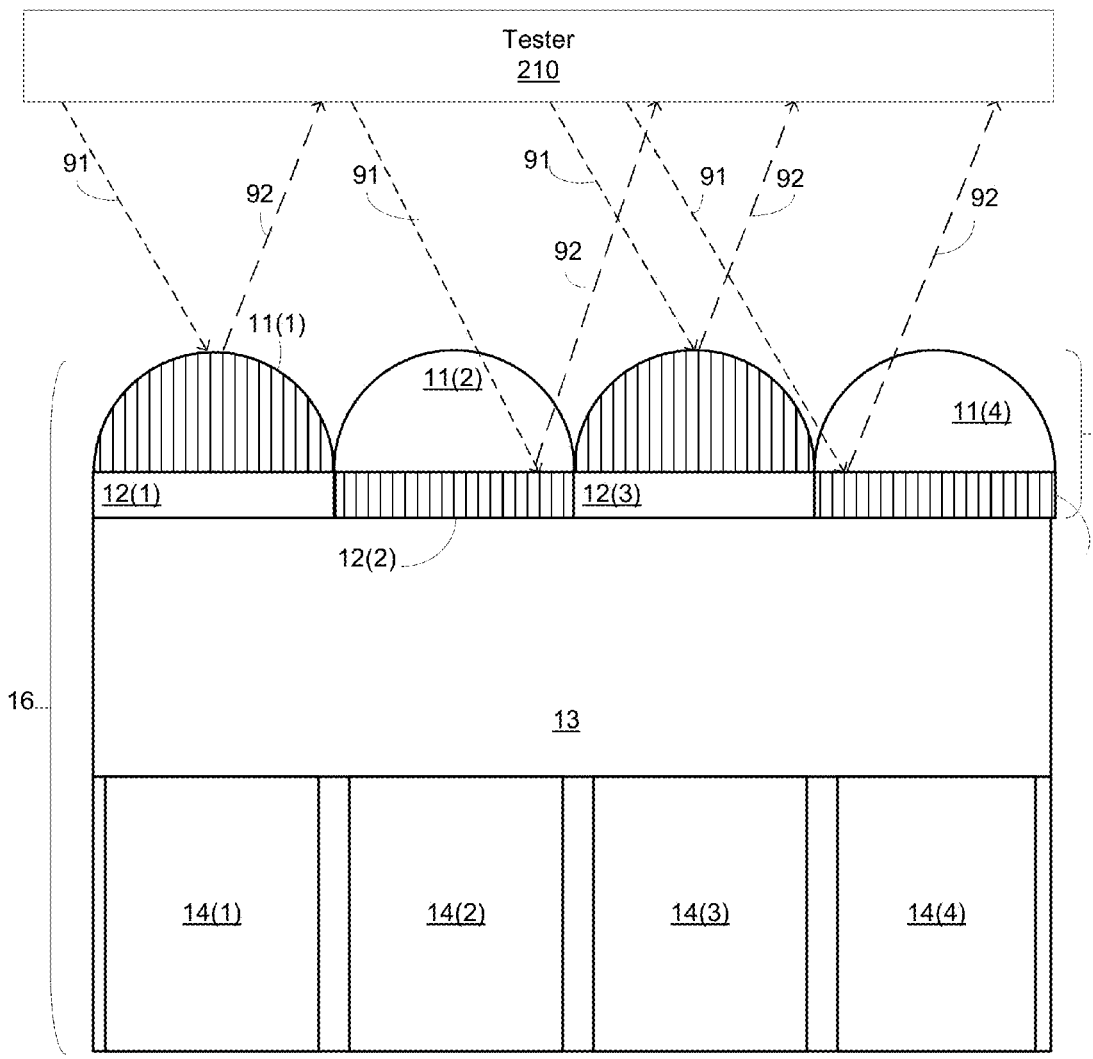
FIG. 2B illustrates a tester and a portion of an image sensor module according to an embodiment of the invention.

FIG. 2B illustrates tester 210 and a portion of an image sensor module 10 according to an embodiment of the invention.

In FIG. 2B the luminescent materials of color filter 12(2), lens 11(1), lens 11(3) and color filter 12(4) are the same.

Tester 210 illuminates die 16 with a first frequency radiation 91 (for example infrared or ultra violet radiation) that is oriented (but not normal) to die 16 (tilted illumination).

This causes each one of lenses 11(1) and 11(3) and each one of color filters 12(2) and 12(4) to convert the first frequency radiation 91 to second frequency radiation 92 (for example visible light radiation) that is sensed by tester 220.

Figure 3A:
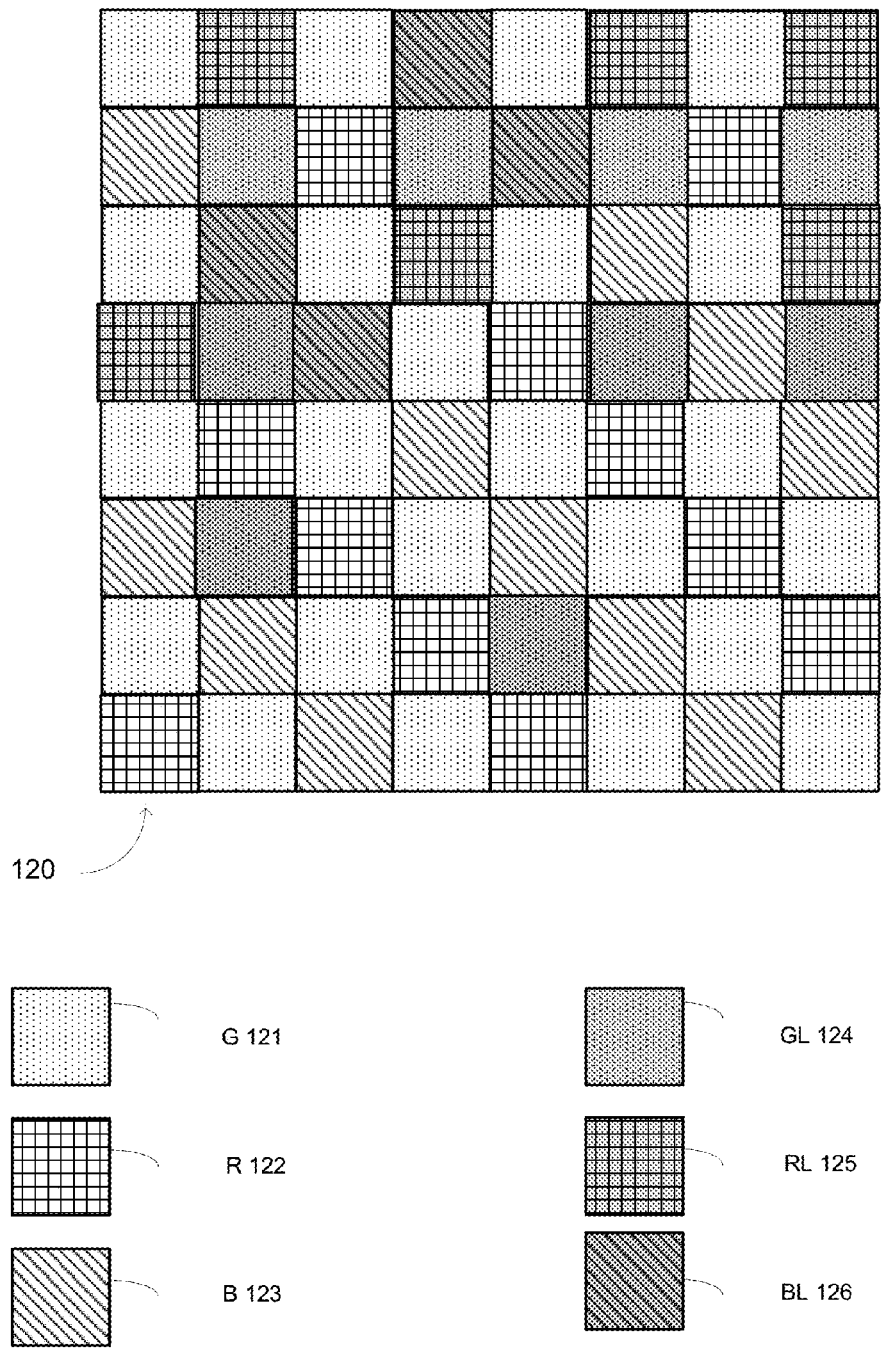
FIG. 3A illustrates an array of color filters that are arranged according to the Bayer pattern according to an embodiment of the invention.

FIG. 3A illustrates an array 120 of color filters 121-126 that are arranged according to the Bayer pattern according to an embodiment of the invention.

Array 120 includes eight columns and eight rows of color filters. Table 1 illustrates the content of the array, wherein:
 a. G represents a green filter that does not include luminescent material (denoted 121 in FIG. 3).
 b. R represents a red filter that does not include luminescent material (denoted 122 in FIG. 3).
 c. B represents a blue filter that does not include luminescent material (denoted 123 in FIG. 3).
 d. GL represents a green filter that included luminescent material (denoted 124 in FIG. 3).
 e. RL represents a red filter that includes luminescent material (denoted 125 in FIG. 3).
 f. BL represents a blue filter that includes luminescent material (denoted 126 in FIG. 3).

TABLE 1

| G | RL | G | BL | G | RL | G | BL |
|---|----|---|----|---|----|---|----|
| B | GL | RL | GL | BL | GL | R | GL |
| G | RL | G | BL | G | R | G | BL |
| BL | GL | RL | G | B | GL | R | G |
| G | R | G | B | G | R | G | B |
| B | GL | R | G | B | G | R | G |
| G | R | G | B | GL | R | G | B |
| B | G | R | G | B | G | R | G |

Table 1 illustrates that nineteen color filters include luminescent material—and thus are luminescent elements. Each luminescent element may represent one or more bits. A concentration of the luminescent material within a luminescent element, a composition of the luminescent material and/or the decay kinetics of each luminescent element may represent one or more bits of information per each luminescent element.

Assuming that each luminescent element represent only a single bit then table 1 represent the following information:
 01010101
 01111101
 01010001
 11100100
 00000000
 01000000
 00001000
 00000000

This is a non-limiting example of a pattern that may embed information.

According to another embodiment of the information is represented by the luminescence material that is used (when used) for each color filter and lens. In this embodiment all the color filters of the same color have the same composition.

Each luminescent material may represent one or more bits. A concentration of the luminescent material within a luminescent element, a composition of the luminescent material and/or the decay kinetics of each luminescent element may represent one or more bits of information per luminescent elements that are made of the same luminescent material.

Figure 3B:
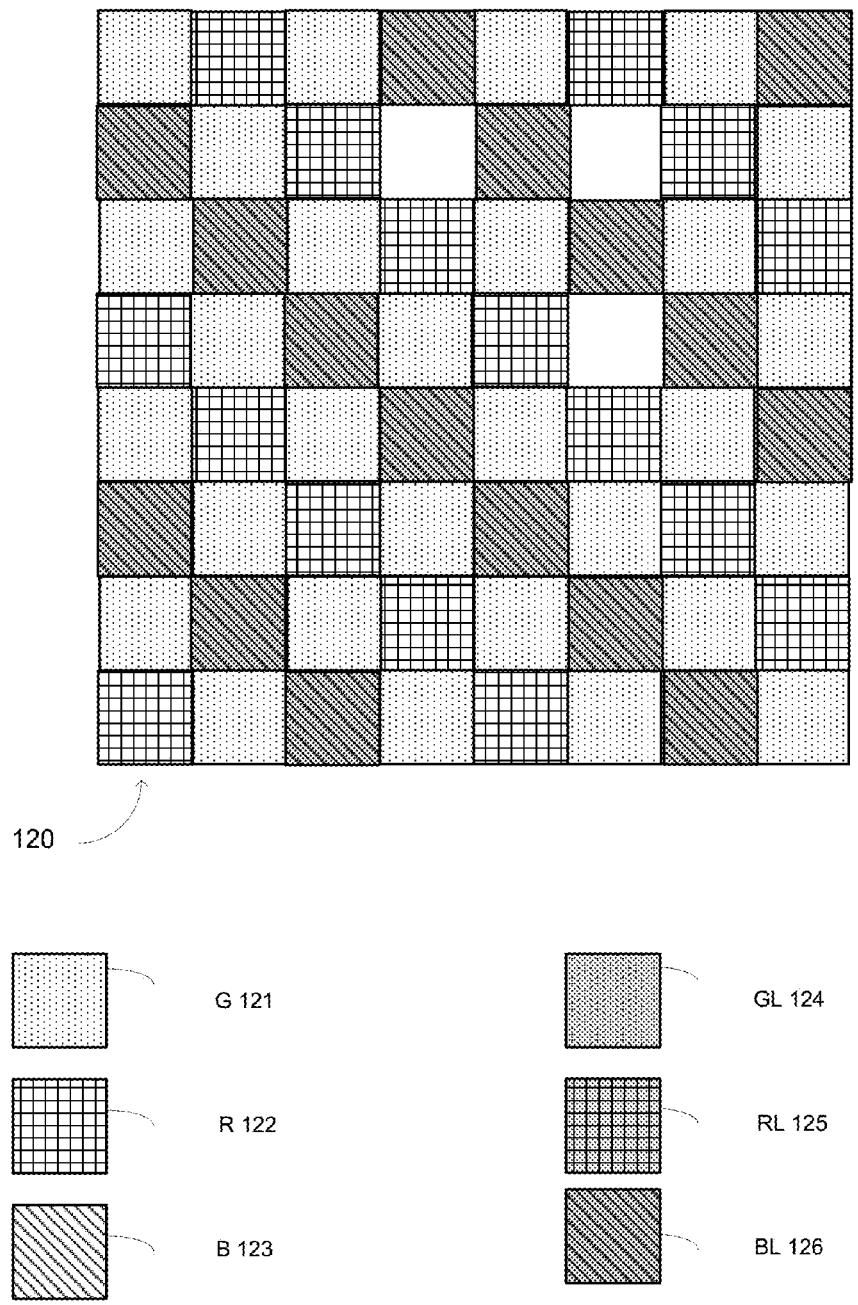
FIG. 3B illustrates an array of color filters that are arranged according to the Bayer pattern according to an embodiment of the invention.

In FIG. 3B only the blue color filters include luminescent material while the green and red filters do not include luminescent materials.

Figure 3C:
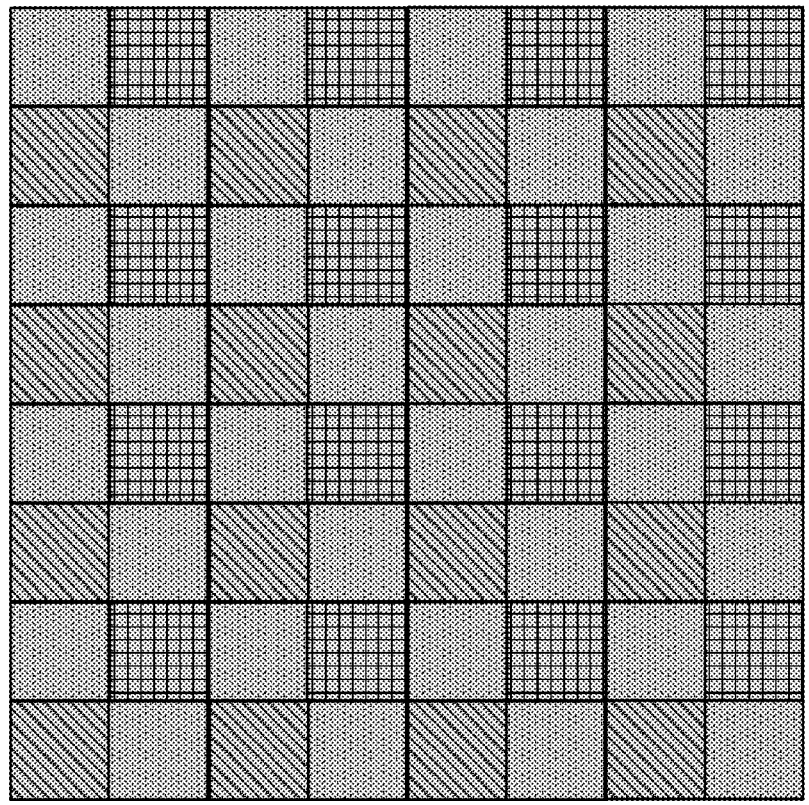
FIG. 3C illustrates an array of color filters that are arranged according to another Bayer pattern according to an embodiment of the invention.
Figure 3C:
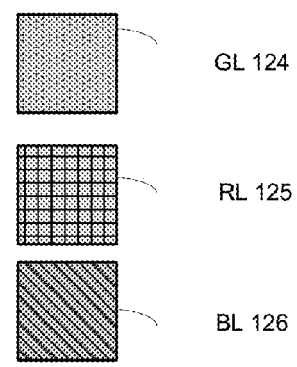

In FIG. 3C all color filters include luminescent material and the color filters are arranged in a Bayer pattern that include rows of alternating green and red color filters and rows of alternating green and blue color filters.

Figure 4A:
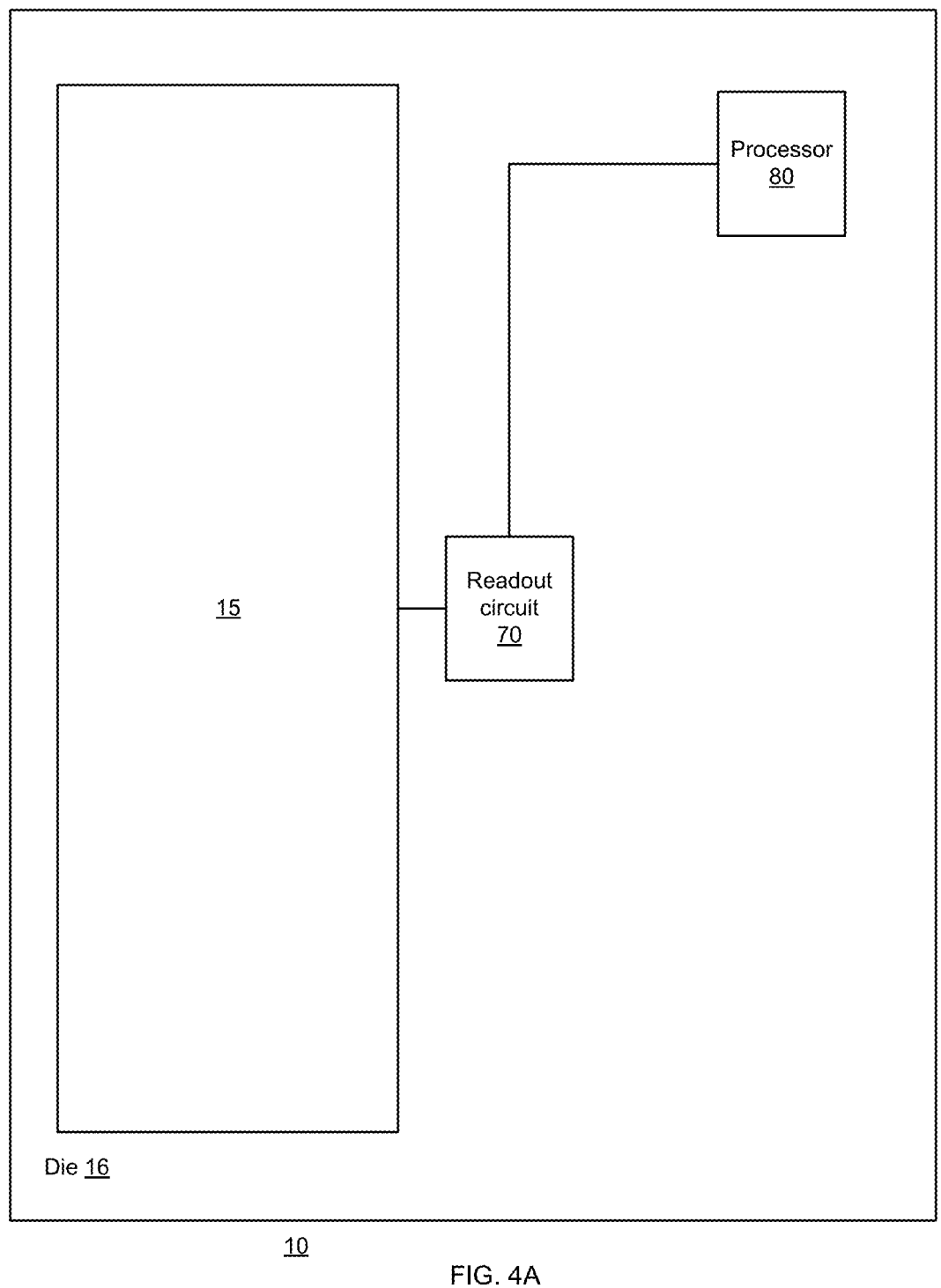
FIG. 4A illustrates an image sensor module according to an embodiment of the invention.

FIG. 4A illustrates image sensor module 10 according to an embodiment of the invention. The image sensor module 10 includes die 16. Die 16 includes optics 15, readout circuit 70 and processor 80. The light sensors are positioned below optics 15 and are not shown.

According to other embodiments of the invention the readout circuit 70 and/or the processor 80 may be included in another die.

For example—optics 15 and light sensors (not shown) may be included in die 16 while readout circuit 70 and/or processor 80 can be included in another die (not shown)—wherein the die (16) and the other die belong to a three-dimensional stack of dice.

The readout circuit 70 is configured to receive signals from the light sensors and to output readout information indicative of the detected radiation.

When the luminescent elements of the image sensor module 10 are illuminated by illuminating radiation that is expected to trigger an excitation of the luminescent elements then the signals and the readout information are indicative of a response of the luminescent elements to the illumination by the illuminating radiation.

The processor 80 is configured to process the readout information and to extract die manufacturing information and/or to authenticate the image sensor module.

Alternatively, the readout circuit 70 may extract die manufacturing information and/or to authenticate the image sensor module.

The authentication may include determining whether the radiation emitted from the luminescent elements matches an expected optical property of the luminescent elements.

The expected optical property of the luminescent elements may be a spectral response of the luminescent elements. It has been found that is quite hard to find and reverse engineer the exact composition of a luminescent material that will lead to a specific spectral response and/or specific luminescence decay kinetics.

If a luminescent element is made of that exact composition its specific spectral response (and/or specific luminescence decay kinetics) may be used to authenticate the image sensor module that includes that luminescent element—by comparing the spectral response (and/or luminescence decay kinetics) of that luminescent element to the specific spectral response (and/or specific luminescence decay kinetics).

It is assumed that counterfeit image sensor module will not include luminescent element with the specific spectral response (and/or specific luminescence decay kinetics).

Although FIG. 4A illustrates a die 16 that includes the optics 15 and the readout circuit 70—the readout circuit 70 may belong to another die. It is further noted that the die may include the processor 80 or may not include the processor 80.

Figure 4B:
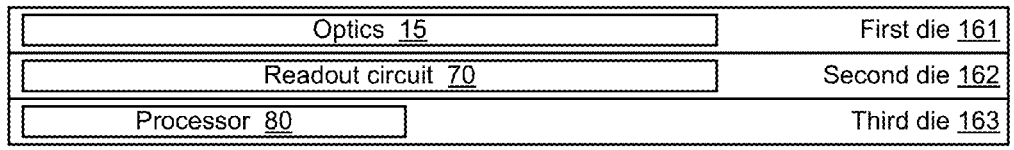
FIG. 4B illustrates an image sensor module according to an embodiment of the invention.
Figure 4B:
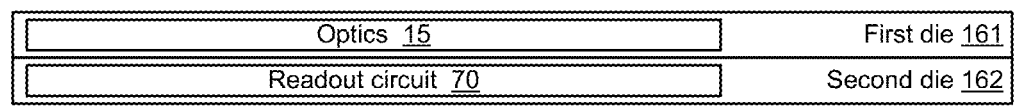
Figure 4B:

FIG. 4B illustrates image sensor modules 10', 10" and 10''' according to various embodiments of the invention.

Image sensor module 10' includes a stack of three dies 161, 162 and 163. First die 161 includes light sensors and optics 15. Second die 162 includes readout circuit 70. Third die 163 includes processor 80.

Image sensor module 10" includes a stack of two dies 161 and 162 and a third die 163 that does not belong to the stack. First die 161 includes light sensors and optics 15. Second die 162 includes readout circuit 70. Third die 163 includes processor 80.

Image sensor module 10''' includes a stack of two dies 161 and 162. First die 161 includes optics 15. Second die 162 includes readout circuit 70 and processor 80.

Figure 5:
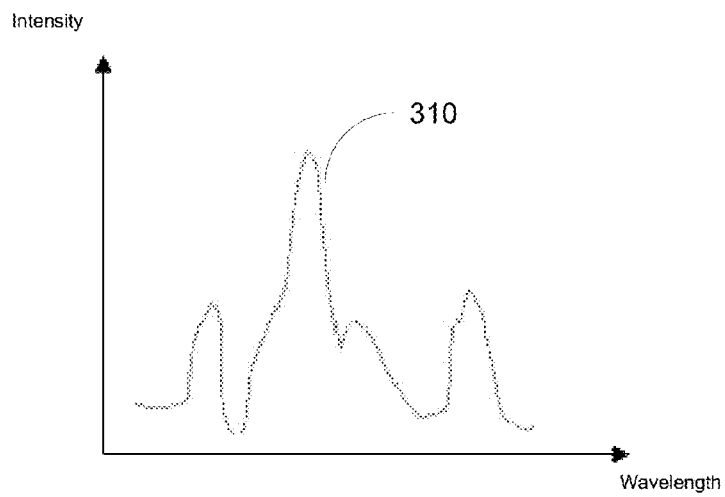
FIG. 5 illustrates a spectral response of a luminescent element according to an embodiment of the invention.

FIG. 5 illustrates a spectral response 310 of a luminescent element according to an embodiment of the invention.

The spectral response 310 represents the intensities (y-axis) of luminescence radiation as a function of wavelength (x-axis).

Figure 6:
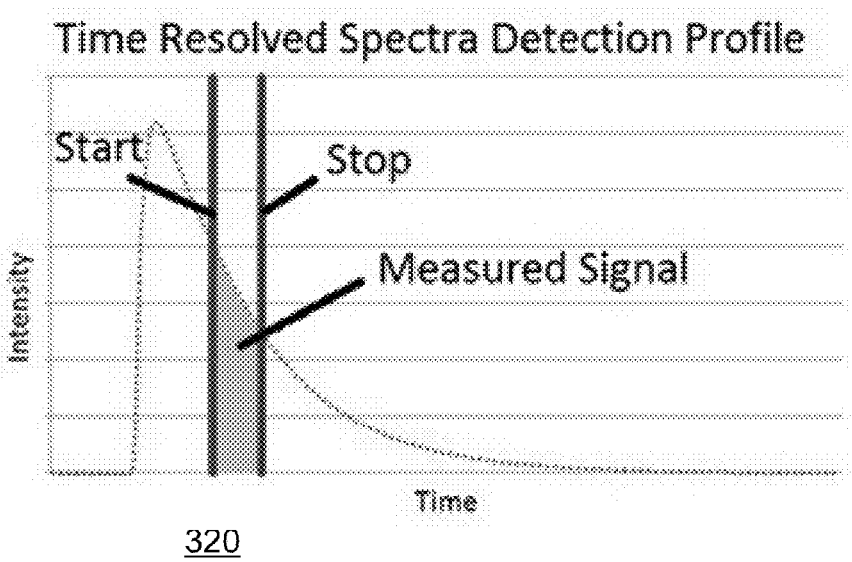
FIG. 6 illustrates luminescence decay kinetics of a luminescent element according to an embodiment of the invention.

FIG. 6 illustrates luminescence decay kinetics 320 of a luminescent element according to an embodiment of the invention.

The luminescence decay kinetics 320 represents decay (y-axis represents the intensity) of luminescence radiation as a function of time (x-axis) after a stopping an illumination of a luminescent element.

Figure 7:
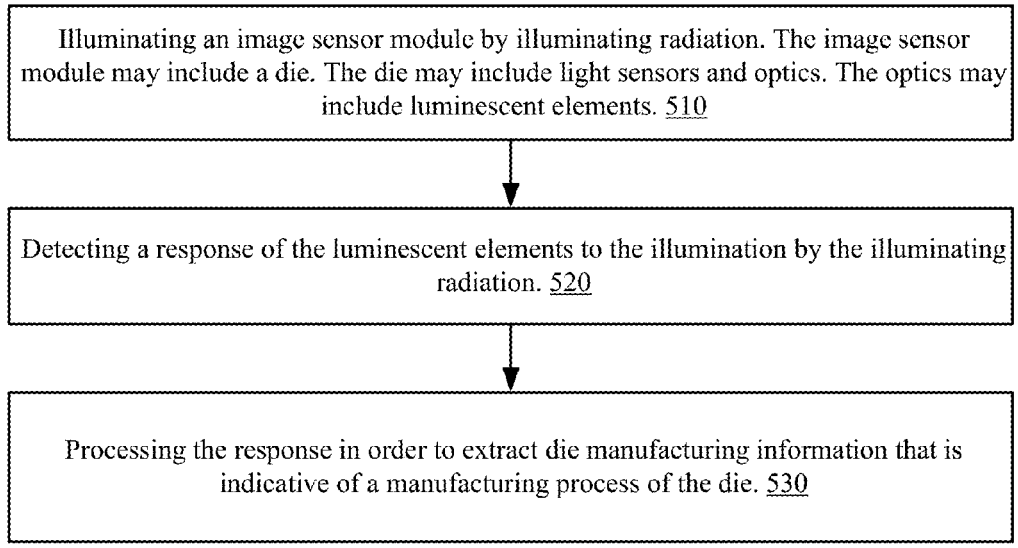
FIG. 7 illustrates a method according to an embodiment of the invention.

FIG. 7 illustrates method 500 according to an embodiment of the invention.

Method 500 may include step 510 of illuminating an image sensor module by illuminating radiation. The image sensor module may include a die. The die may include light sensors and optics. The optics may include luminescent elements.

Step 510 may be followed by step 520 of detecting a response of the luminescent elements to the illumination by the illuminating radiation.

Step 520 may be followed by step 530 of processing the response in order to extract die manufacturing information that is indicative of a manufacturing process of the die.

Step 520 and/or step 530 may be partially executed by the image sensor module, solely executed by the image sensor module, partially executed by a device that differs from the image sensor module or solely executed by the device that differs from the image sensor module. Non-limiting examples of such devices are provided in FIGS. 2A and 2B—see illumination module 210 of FIG. 2A and illumination and sensing module 220 of FIG. 2B.

Figure 8:
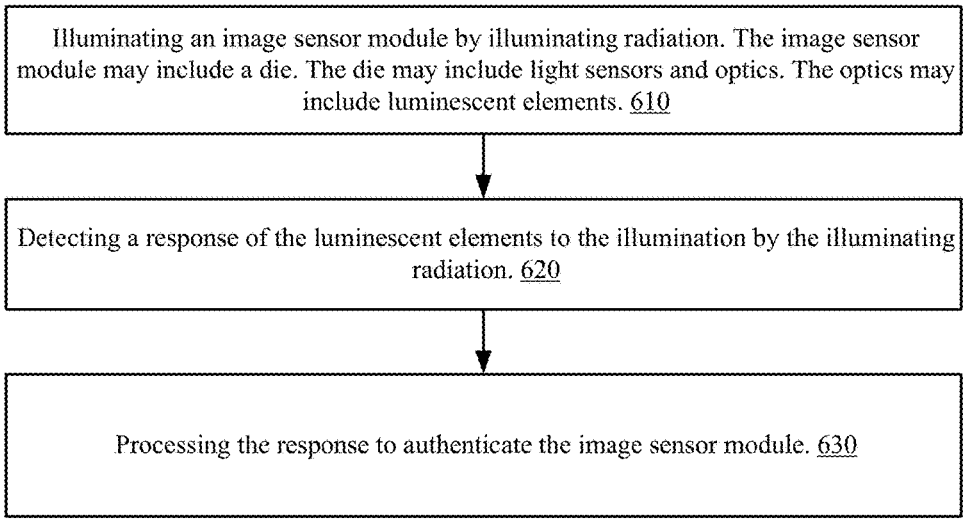
FIG. 8 is a cross sectional view of a die according to an embodiment of the invention.

FIG. 8 illustrates method 600 according to an embodiment of the invention.

Method 600 may include step 610 of illuminating an image sensor module by illuminating radiation. The image sensor module may include a die. The die may include light sensors and optics. The optics may include luminescent elements.

Step 610 may be followed by step 620 of detecting a response of the luminescent elements to the illumination by the illuminating radiation.

Step 620 may be followed by step 630 of processing the response to authenticate the image sensor module.

Step 620 and/or step 630 may be partially executed by the image sensor module, solely executed by the image sensor module, partially executed by a device that differs from the image sensor module or solely executed by the device that differs from the image sensor module. Non-limiting examples of such devices are provided in FIGS. 2A and 2B—see illumination module 210 of FIG. 2A and illumination and sensing module 220 of FIG. 2B.

Step 630 may include extracting authentication information.

Step 630 may include determining whether the radiation emitted from the luminescent elements matches an expected optical property of the luminescent elements.

The expected optical property of the luminescent elements may be a spectral response of the luminescent elements and/or luminescence decay kinetics of the luminescent elements.

According to an embodiment of the invention method 500 and method 600 may be merged.

Any reference to any of the terms "comprise", "comprises", "comprising" "including", "may include" and "includes" may be applied to any of the terms "consists", "consisting", "consisting essentially of". For example—any of the rectifying circuits illustrated in any figure may include more components that those illustrated in the figure, only the components illustrated in the figure or substantially only the components illustrate din the figure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. An image sensor module that comprises a die, wherein the die comprises light sensors and optics; wherein the optics comprises luminescent elements that have an expected optical property that once detected authenticates the image sensor module; wherein the light sensors are configured to receive light that passed through the luminescent elements; wherein the optics comprises a group of lenses and a group of color filters; and wherein two color filters of the group of color filters form luminescent elements that differ from each other by at least one out of composition and concentration.

2. The image sensor module according to claim 1 wherein the expected optical property of the luminescent elements is a spectral response of the luminescent elements.

3. The image sensor module according to claim 1 wherein the expected optical property of the luminescent elements is luminescence decay kinetics of the luminescent elements.

4. The image sensor module according to claim 1 wherein at least one lens of the group of lenses and at least one color filter of the group of color filters form luminescent elements that differ from each by at least one out of composition and concentration.

5. The image sensor module according to claim 1 wherein the optics is made of a polymer material.

6. The image sensor module according to claim 1 wherein the optics is made of a photoresist.

7. The image sensor module according to claim 1 wherein the optics is positioned on a backside of the die.

8. The image sensor module according to claim 1 wherein the optics is positioned on a front side of the die.

9. The image sensor module according to claim 1 wherein the die further comprises a readout circuit that is configured to receive signals from the light sensors.

10. The image sensor module according to claim 1 wherein a concentration of a luminescent material within a luminescent element does not exceed five percent.

11. The image sensor module according to claim 1 wherein the luminescent elements exhibit a luminescence decay time that ranges between fifty milliseconds and one second.

12. The image sensor module according to claim 1 wherein a luminescent element of the luminescent element has an attenuation that is less than ten percent to radiation sensed by a light sensor of the light sensors.

13. The image sensor module according to claim 1 wherein radiation emitted by the luminescent elements is below a detection level of the light sensors.

14. An image sensor module that comprises a die, wherein the die comprises light sensors and optics; wherein the optics comprises luminescent elements that have an expected optical property that once detected authenticates the image sensor module; wherein the light sensors are configured to receive light that passed through the luminescent elements; wherein the optics comprises a group of lenses and a group of color filters; and wherein at least one of the following is true: (a) at least two color filters of the group of color filters form luminescent elements luminescent elements that have a same composition and concentration; and (b) at least one lens of the group of lenses and at least one color filter of the group of color filters form luminescent elements luminescent elements that have the same composition and concentration.

15. The image sensor module according to claim 14 wherein at least one lens of the group of lenses and at least one color filter of the group of color filters form luminescent elements that have a same composition and concentration.

16. An image sensor module that comprises a die, wherein the die comprises light sensors and optics; wherein the optics comprises luminescent elements that have an expected optical property that once detected authenticates the image sensor module; wherein the light sensors are configured to receive light that passed through the luminescent elements; wherein the image sensor further comprises a readout circuit, wherein the light sensors and the readout circuit are included in different dice of the image sensor module.

17. A method for evaluating an image sensor module, the method comprises:

illuminating the image sensor module by illuminating radiation for triggering an excitation of luminescent elements of the image sensor module; wherein the image sensor module comprises a die, wherein the die comprises light sensors and optics; wherein the optics comprises the luminescent elements; wherein the luminescent elements are positioned between a source of the illuminating radiation and the light sensors; wherein the optics comprises a group of lenses and a group of color filters; and wherein at least one lens of the group of lenses and at least one color filter of the group of color filters form luminescent elements that have the same composition and concentration;

detecting a response of the luminescent elements to the illumination by the illuminating radiation; and processing the response in order to extract die manufacturing information that is indicative of a manufacturing process of the die or authenticate the image sensor module.

18. The method according to claim 17 comprising processing the response to extract only die manufacturing information.

19. The method according to claim 17 comprising processing the response to extract, during the authentication of the image sensor module, authentication information.

20. The method according to claim 17 wherein the detecting of the response is executed by the image sensor module.

21. The method according to claim 17 wherein the die manufacturing information is timing information about a timing of execution of the manufacturing process of the die.

22. An image sensor module that comprises a die, wherein the die comprises light sensors and optics; wherein the optics comprises luminescent elements that have an expected optical property that once detected authenticates the image sensor module; wherein the light sensors are configured to receive light that passed through the luminescent elements wherein a luminescent element of the luminescent element is configured to perform frequency down-conversion at a first frequency, perform frequency up-conversion at a second frequency and perform a luminescence decay at a third frequency.

* * * * *